(12) United States Patent
Aldragen

(10) Patent No.: US 9,673,824 B2
(45) Date of Patent: Jun. 6, 2017

(54) TECHNIQUES AND CIRCUITRY FOR CONFIGURING AND CALIBRATING AN INTEGRATED CIRCUIT

(71) Applicant: Altera Corporation, San Jose, CA (US)

(72) Inventor: Tamil Selvi Aldragen, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 474 days.

(21) Appl. No.: 13/662,193

(22) Filed: Oct. 26, 2012

(65) Prior Publication Data

US 2014/0118026 A1    May 1, 2014

(51) Int. Cl.
*H03K 19/177* (2006.01)
*G11C 8/00* (2006.01)
*G06F 15/177* (2006.01)
*G01R 31/28* (2006.01)

(52) U.S. Cl.
CPC ....... *H03K 19/1776* (2013.01); *G06F 15/177* (2013.01); *G11C 8/00* (2013.01); *G01R 31/28* (2013.01)

(58) Field of Classification Search
CPC ....... H03K 19/17744; H03K 19/17772; H03K 19/1776; H03K 19/17748; H03K 19/17756; H03K 19/17736; G01R 31/318572; G01R 31/28; G11C 8/00
USPC ........................ 326/37, 41–47, 101; 716/116
See application file for complete search history.

(56) References Cited

U.S. PATENT DOCUMENTS

| | | | | |
|---|---|---|---|---|
| 6,459,297 | B1 * | 10/2002 | Smiley | G06F 17/5054 326/38 |
| 6,732,263 | B1 * | 5/2004 | May et al. | 713/1 |
| 7,071,726 | B1 * | 7/2006 | Chan | H03K 19/17732 326/37 |
| 7,126,372 | B2 * | 10/2006 | Vadi | H03K 19/173 326/38 |
| 7,301,824 | B1 * | 11/2007 | New | 365/189.011 |
| 7,376,037 | B1 * | 5/2008 | Law | G11C 5/144 365/226 |
| 7,418,579 | B2 | 8/2008 | Guibert et al. | |
| 7,598,768 | B1 * | 10/2009 | Tetzlaff | G05B 19/054 326/38 |
| 7,599,299 | B2 | 10/2009 | Goetting et al. | |
| 7,919,979 | B1 | 4/2011 | Mason et al. | |
| 8,086,922 | B1 * | 12/2011 | Camarota | 714/725 |
| 8,171,121 | B2 | 5/2012 | Ayyar et al. | |
| 8,174,287 | B2 | 5/2012 | German et al. | |
| 8,610,462 | B1 * | 12/2013 | Wang | H03K 3/356113 326/68 |
| 2004/0049623 | A1 * | 3/2004 | Barnett | 710/305 |
| 2008/0258758 | A1 * | 10/2008 | Kaizu | 326/38 |
| 2009/0058462 | A1 | 3/2009 | Mason et al. | |

(Continued)

*Primary Examiner* — Dylan White

(57) ABSTRACT

A technique for configuring an integrated circuit includes receiving configuration data from an external element with an interface circuit. The configuration data may include an identification field and an instruction for configuring a logic block. Configuration circuitry may be used to identify the logic block to be configured based on the identification field. A storage element in the identified logic block is configured by the configuration circuitry based on the instruction.

20 Claims, 7 Drawing Sheets

(56) References Cited

U.S. PATENT DOCUMENTS

| | | | |
|---|---|---|---|
| 2011/0068823 A1* | 3/2011 | German | H03K 19/17744 326/37 |
| 2012/0112786 A1* | 5/2012 | Fox | 326/16 |
| 2012/0256653 A1* | 10/2012 | Cordero et al. | 326/16 |
| 2012/0286821 A1* | 11/2012 | Hooi et al. | 326/38 |

* cited by examiner

TECHNIQUES AND CIRCUITRY FOR CONFIGURING AND CALIBRATING AN INTEGRATED CIRCUIT

BACKGROUND

Programmable integrated circuit devices, such as field-programmable gate arrays (FPGAs), may include generic structures and logic blocks that can be configured to perform any of a variety of functions. Such devices may also be reconfigured to meet changing operational requirements.

For instance, such devices may be configurable to communicate with external circuitry that may be connected to them through different input-output protocols. Accordingly, in order to configure an input-output block to support a particular protocol, a controller module may be included in the device. Typically, the controller module may be an embedded circuit module formed by logic blocks in the device.

Generally, as an embedded controller module is pre-defined or pre-configured (e.g., the module or circuit may be predetermined during a compilation operation of the design), the controller may only be used for the specific protocol that it is configured for. If the device needs to be adapted to support a different protocol, the embedded controller may need to be reconfigured to meet different requirements.

However, in order to reconfigure the embedded controller, the design on the device may need to be updated and recompiled. Such a solution, even though feasible, may not be ideal as it may be time-consuming and cumbersome to recompile the design every time the embedded controller is updated.

As such, multiple controllers may be needed in the device, especially when different logic blocks in the device are configured to support different protocols. Furthermore, as the controller modules are formed by actual logic elements in the device, additional logic resources may need to be allocated for the dedicated controller modules.

SUMMARY

Techniques for configuring an integrated circuit device without having to update or reload a design are provided. For example, a programmable integrated circuit device may include programmable logic circuitry that is initially configured with a custom logic design. During normal operation (i.e., runtime), the programmable logic circuitry performs functions defined by the custom logic design. In some scenarios, it may be desirable to reconfigure a portion of the programmable logic circuitry while remaining portions of the programmable logic circuitry continue to perform their initially configured functions. Embodiments of the present invention include circuits and techniques to reconfigure at least part of the device without recompiling the design on the device (e.g., during runtime).

It is appreciated that the present invention can be implemented in numerous ways, such as a process, an apparatus, a system, a device, or a method on a computer readable medium. Several inventive embodiments of the present invention are described below.

A method of operating an integrated circuit having a plurality of logic blocks includes receiving configuration data from an external element with an interface circuit. The configuration data may include an identification field and an instruction for configuring a logic block in the integrated circuit. The logic block to be configured may be identified with configuration circuitry based on the identification field. A storage element in the identified logic block may be configured by the configuration circuitry based on the instruction.

A technique for configuring an integrated circuit includes receiving configuration data using a first interface protocol from an external element with an interface circuit. The configuration data may be converted from the first interface protocol to a second interface protocol with a bridge circuit. The converted configuration data may be subsequently routed to logic blocks through interconnects. The logic blocks may have decoder circuits that have been assigned respective identification values. Each decoder circuit may match its assigned identification value with the configuration data (e.g., by comparing its assigned identification value to an identification field in the configuration data). In response to determining that the configuration data matches its assigned identification value, a given decoder circuit may configure its corresponding logic block based on the configuration data (e.g., based on an instruction in the configuration data).

An integrated circuit includes an interface circuit operable to receive configuration data from an external circuit using a first protocol. The integrated circuit may further include bridge circuitry operable to receive the configuration data from the interface circuit. The bridge circuitry may also be operable to convert the configuration data from the first protocol to a second protocol. The integrated circuit may include logic blocks operable to receive the configuration data from the bridge circuitry using the second protocol. Each logic block may include one or more storage elements operable to store the configuration data.

Further features of the invention, its nature and various advantages will be more apparent from the accompanying drawings and the following detailed description of the preferred embodiments.

DETAILED DESCRIPTION

The embodiments provided herein include circuitry and techniques to configure and operate an integrated circuit device.

It will be obvious, however, to one skilled in the art, that the present exemplary embodiments may be practiced without some or all of these specific details. In other instances, well-known operations have not been described in detail in order not to unnecessarily obscure the present embodiments.

An integrated circuit (IC) device generally includes circuitry or logic blocks that may be customized to perform different functions. The device may also be coupled to other circuit elements through various input-output interfaces. For instance, when the device is communicating with an external memory module, different memory interfaces may be used (e.g., single data rate (SDR), double data rate (DDR), etc.). Accordingly, an interface circuit (e.g., a memory controller) may be needed to facilitate communication between the device and any external circuit elements that may be coupled to it.

Logic blocks or resources in the IC device may then be configured or customized as interface circuitry to support any of a variety of protocols. However, if the IC device needs to support a different protocol during operation, the IC device may need to be powered down so that the design on the IC device may be recompiled before being reloaded to the IC device.

Custom IC devices, such as application specific integrated circuit (ASIC), and to a certain extent, structured ASIC devices, may be customized to support different interface protocols. Embedded interface modules (e.g., a memory controller module, etc.) may be included in a custom IC device. However, as such devices are generally not reconfigurable, the functionality of the embedded interface module, such as a memory controller module, may be restricted to its initial configuration.

Furthermore, depending on different factors (e.g., user design, architecture of the device being used, etc.), more than one embedded interface module may be needed. For instance, if the particular user design utilizes different memory protocols, multiple embedded memory controllers may be needed. Multiple embedded memory controllers may be needed (to ease routing congestion on the device), too, if logic blocks (e.g., transceiver blocks) communicating with the embedded memory controllers are placed far apart from each other.

One of the embodiments described herein provides a technique for operating an IC device that may allow the device to be dynamically reconfigured during runtime (e.g., without having to recompile the design on the device). Another embodiment provides an integrated circuit without a dedicated embedded interface module (e.g., a memory controller module) that may be operable to be reconfigured through an input-output interface (e.g., a Joint Test Action Group interface).

Figure 1:
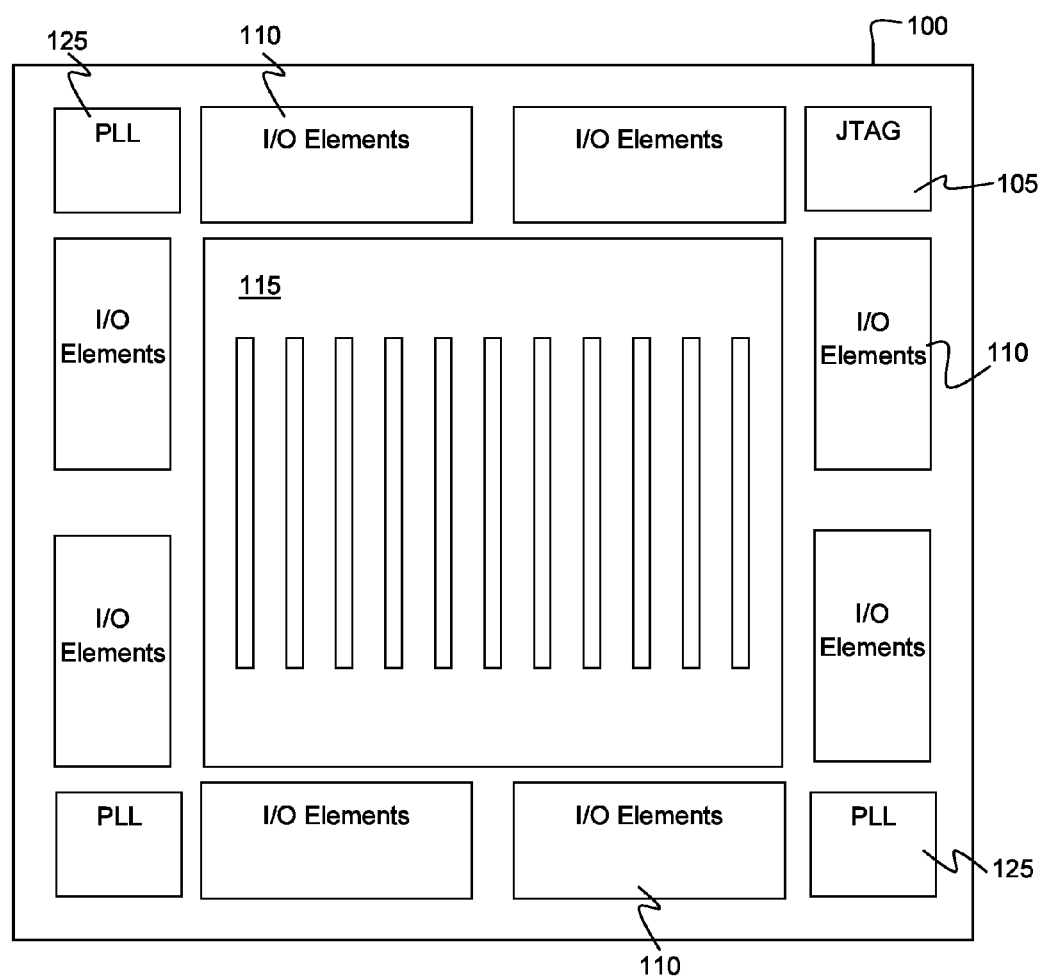
FIG. 1 is a simplified block diagram of an illustrative integrated circuit as in accordance with one embodiment of the present invention.

FIG. 1, meant to be illustrative and not limiting, shows a simplified block diagram of IC 100 that can implement embodiments of the present invention. IC 100 includes core logic region 115 and input-output elements 110. Other auxiliary circuits such as phase-locked loops (PLLs) 125 for clock generation and timing, can be located outside the core logic region 115 (e.g., at corners of IC 100 and adjacent to input-output elements 110).

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to produce control signals that configure the LEs and groups of LEs and LABs to perform the desired logical functions. Core logic region 115 may also include a plurality of embedded memory blocks (not shown) that can be used to perform a variety of functions.

Input-output elements 110 may also include input-output buffers that connect IC 100 to other external components. Signals from core region 115 are transmitted through input-output elements 110 to external components that may be connected to IC 100. It should be appreciated that a single device like IC 100 can potentially support a variety of different interfaces and each individual input-output bank 110 can support a different input-output standard with a different interface or a different voltage level.

Accordingly, IC 100 may receive signals from external circuitry at input-output elements 110 and the signals may be routed from input-output elements 110 to core logic region 115 and other logic blocks on IC 100. Core logic region 115 and other logic blocks on IC 100 may perform different functions based on the signals received.

In the embodiment of FIG. 1, IC 100 may include a Joint Test Action Group (JTAG) interface block 105. It should be appreciated that a JTAG interface may be an input-output interface that may be used, among others, for debugging and transferring data from an external component to the device (e.g., IC 100). In an exemplary embodiment, JTAG interface block 105 may be operable to receive configuration information from an external component and may be further operable to transmit the configuration information to other logic blocks in IC 100.

Figure 2A:
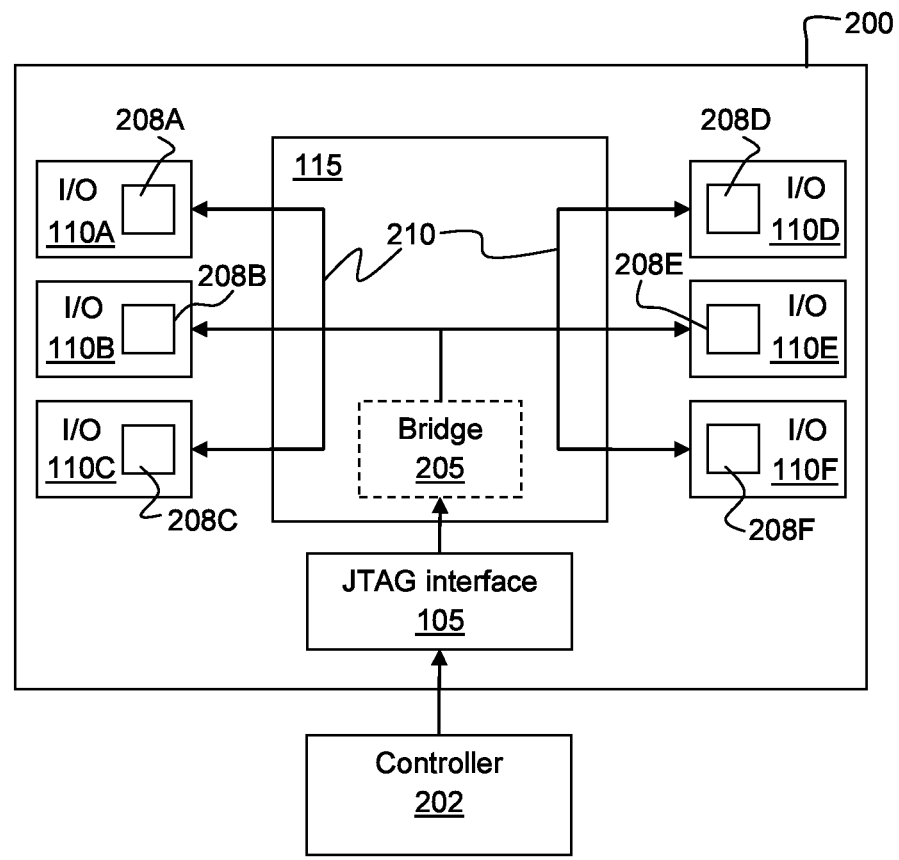
FIG. 2A is a diagram of an illustrative system in which an illustrative integrated circuit is coupled to an external controller circuit in accordance with one embodiment of the present invention.

FIG. 2A shows illustrative IC 200 coupled to a controller circuit 202 in accordance with one embodiment of the present invention. In one embodiment, controller circuit 202 may be a memory controller module that is operable to send configuration data to IC 200. IC 200 may be coupled to controller circuit 202 through JTAG interface circuit 105. It should be appreciated that JTAG interface circuit may include, among others, data input, clock and data output pins. The configuration data may be transmitted to other logic blocks of IC 200 (e.g., input-output blocks 110A-110F). In an exemplary embodiment, input-output blocks 110A-110F may be transceiver blocks that may be configured by controller circuit 202 through JTAG interface circuit 105 and other configuration circuitry within IC 200.

In the embodiment of FIG. 2A, signals (e.g., configuration data) from JTAG interface circuit 105 may be transmitted to bridge circuit 205 in core region 115 of IC 200. Bridge circuit 205 may be coupled to input-output blocks 110A-110F through interconnects 210. In one embodiment, bridge circuit 205 and interconnects 210 may collectively form configuration circuitry used to route configuration data from JTAG interface circuit 105 to input-output blocks 110A-110F. In another embodiment, the configuration circuitry formed by bridge circuit 205 and interconnects 210 may be soft logic circuitry that is part of a user design loaded to IC 200.

In the embodiment of FIG. 2A, each of input-output blocks 110A-110F (e.g., transceiver blocks) may include a storage element (e.g., storage elements 208A-208F) that may store different configuration bits. In one embodiment, input-output blocks 110A-110F may be operable to perform different functions based on the configuration bits stored in storage elements 208A-208F. In an exemplary embodiment, input-output blocks 110A-110F may be reconfigurable by controller circuit 202 coupled to JTAG interface 105 of IC device 200 during runtime (e.g., during normal operation of IC device 200). Depending on the signals or configuration data streams received, any or all of input-output blocks 110A-110F may be configured.

Figure 2B:
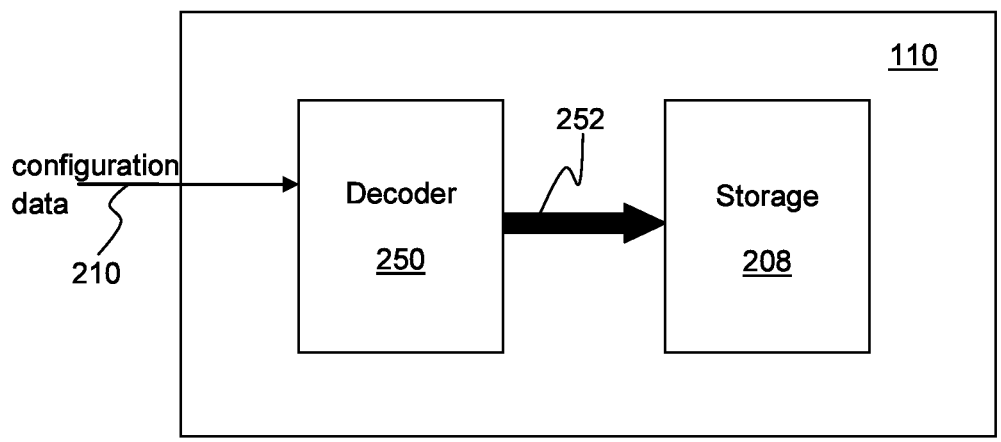
FIG. 2B is a diagram of an illustrative input-output block having a decoder circuit in accordance with one embodiment of the present invention.

FIG. 2B shows illustrative input-output block 110 in accordance with one embodiment of the present invention. Configuration data transmitted by interconnect 210 may be received by a decoder circuit (e.g., decoder circuit 250) before the configuration data is transmitted to storage element 208 in input-output block 110. Decoder circuit 250 may convert the configuration data before the configuration data is transmitted to storage element 208. In one embodiment, decoder circuit 250 may convert the configuration data from one protocol to another (e.g., from the Management Data Input Output (MDIO) protocol to the Dynamic Partial Reconfigurable Input Output (DPRIO) protocol). In another embodiment, the configuration data may be a serial data signal and decoder circuit 250 may include a deserializer circuit that converts the serial data signal to parallel data signals 252, which may be used to configure storage element 208.

Figure 3A:
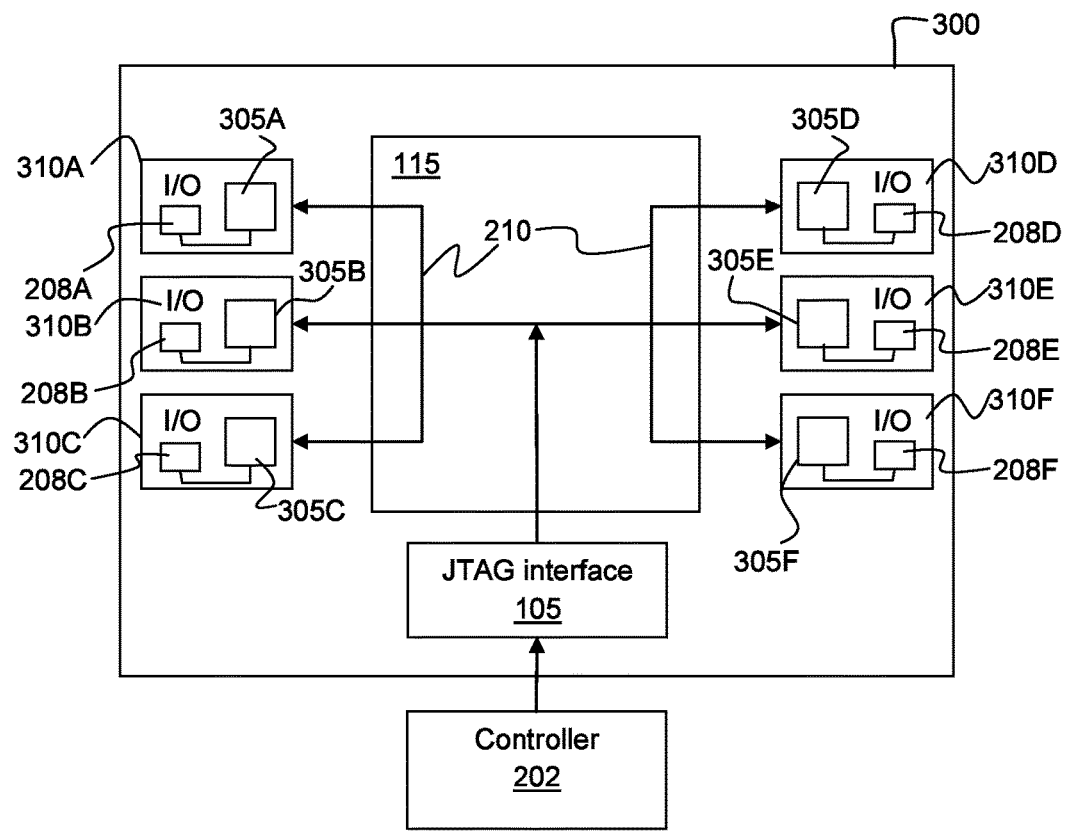
FIG. 3A shows an integrated circuit (IC) device with configuration circuitry in a plurality of input-output blocks.

FIG. 3A shows IC device 300 with configuration circuitry 305A-305F in input-output blocks 310A-310F. It should be appreciated that IC device 300 may share similarities with IC device 100 of FIG. 1 and as such, for the sake of brevity, elements that have been described earlier (e.g., interconnects 210, core region 115, JTAG interface circuit 105) are not described in detail again. In the embodiment of FIG. 3A, IC device 300 may be configured and reconfigured by controller circuit or controller module 202 through JTAG interface circuit 105. Signals (e.g., configuration data) may be transmitted from JTAG interface circuit through interconnects 210.

In the embodiment of FIG. 3A, each of configuration circuitries 305A-305F may be operable to convert the signals or configuration data from one interface to another (e.g., from the JTAG interface to the MDIO interface) before the signals are transmitted to each of the storage elements 208A-208F. In one embodiment, configuration circuitries 305A-305F may include "hard" or actual circuit elements within input-output blocks 310A-310F. In another embodiment, configuration circuitries 305A-305F may include bridge interface circuitry and decoder circuitry, details of which are shown in the embodiment of FIG. 3B.

Figure 3B:
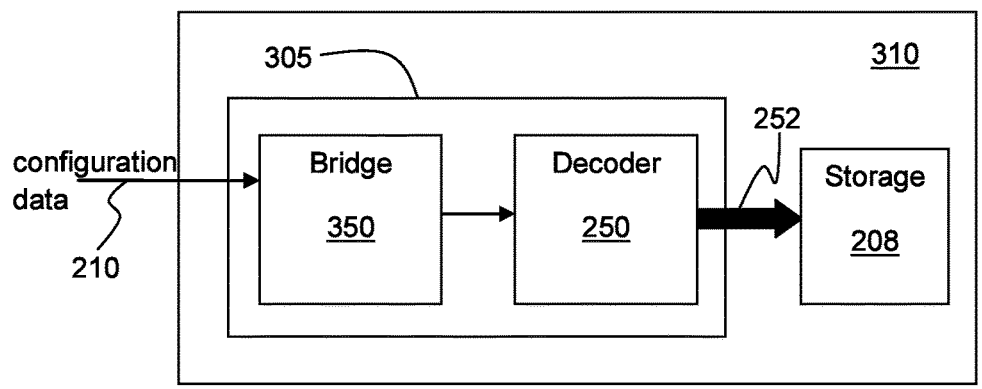
FIG. 3B shows an illustrative input-output block with configuration circuitry in accordance with one embodiment of the present invention.

FIG. 3B shows illustrative input-output block 310 with configuration circuitry 305 in accordance with one embodiment of the present invention. Configuration circuitry 305 may include bridge circuitry 350 and decoder circuitry 250. Bridge circuitry 350 is operable to receive configuration data from interconnect 210. In one embodiment, bridge circuitry may convert the configuration data from one protocol to another before transmitting the configuration data to decoder circuitry 250. The configuration data may further be converted to yet another protocol before being transmitted as parallel output signals 252 to storage element 208. In one embodiment, the configuration data may update the contents of storage element 208.

Figure 4:
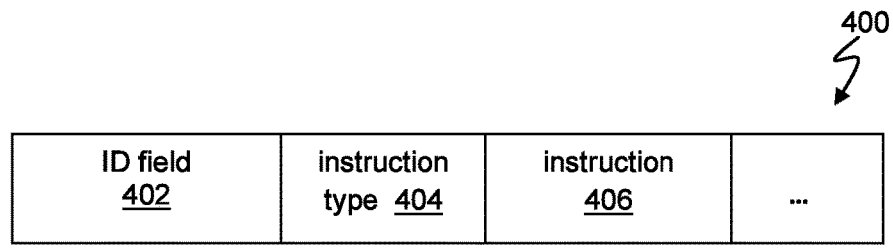
FIG. 4 shows an illustrative instruction stream in accordance with one embodiment of the present invention.

FIG. 4 shows an illustrative instruction stream 400 in accordance with one embodiment of the present invention. In one embodiment, instruction stream 400 may be a configuration data stream from controller module 202 of FIGS. 2A and 3A. Instruction stream 400 may include identification (ID) field 402, instruction type field 404, and instruction field 406. In one embodiment, ID field 402 may include a unique ID (e.g., an address) that is used to identify a particular logic block (e.g., input-output blocks 110D-110F of FIG. 2A) to be configured.

Instruction type field 404 may indicate the type of operation to be performed (e.g., a read or write operation). Accordingly, the device (e.g., IC devices 200 and 300 of FIGS. 2A and 3A, respectively) may be operable to perform either a read or write operation based on instruction stream 400. In one embodiment instruction field 406 in instruction stream 400 may include actual configuration bits that may be used to configure or reconfigure a logic block in the IC device during a write operation. In one embodiment, multiple IC devices similar to IC device 200 of FIG. 2A (or IC device 300 of FIG. 3A) may be coupled to a single controller module similar to controller 202, and ID field 402 may be used to identify the particular IC device (or even specific logic blocks in the IC device) to be reconfigured.

Figure 5:
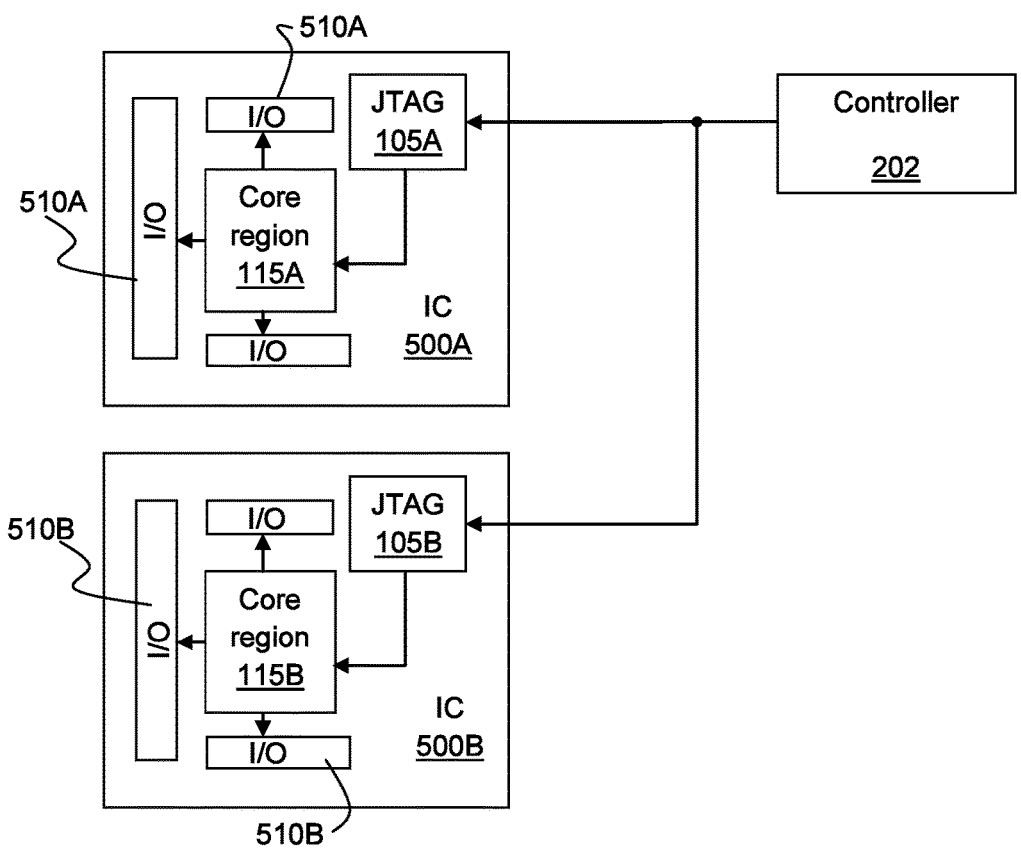
FIG. 5 shows two IC devices coupled to a single controller module in accordance with one embodiment of the present invention.

FIG. 5 shows two IC devices 500A and 500B coupled to a single controller module 202 in accordance with one embodiment of the present invention. It should be appreciated that IC devices 500A and 500B may be similar to either IC device 200 of FIG. 2A or IC device 300 of FIG. 3A. Controller module 202 may be used to configure IC devices 500A and 500B through JTAG interface circuit 105A and 105B, respectively. In one embodiment, controller module 202 may transmit a configuration data stream that includes an ID field, similar to instruction stream 400 of FIG. 4, and depending on the ID field of that particular configuration data stream, either one of devices 500A and 500B may be configured at any one time.

In the embodiment of FIG. 5, the configuration data stream may be transmitted from JTAG interface circuits 105A and 105B to core regions 115A and 115B, respectively. It should be appreciated that core regions 115A and 115B may include interconnect paths that are operable to route the configuration data stream received from the respective JTAG interface circuits 105A and 105B to the appropriate input-output blocks (e.g., input-output blocks 510A and 510B). In one embodiment, the ID field of the configuration data stream transmitted by controller module 202 may further indicate the particular logic block in the particular device (e.g., either IC device 500A or 500B) to be configured.

Figure 6:
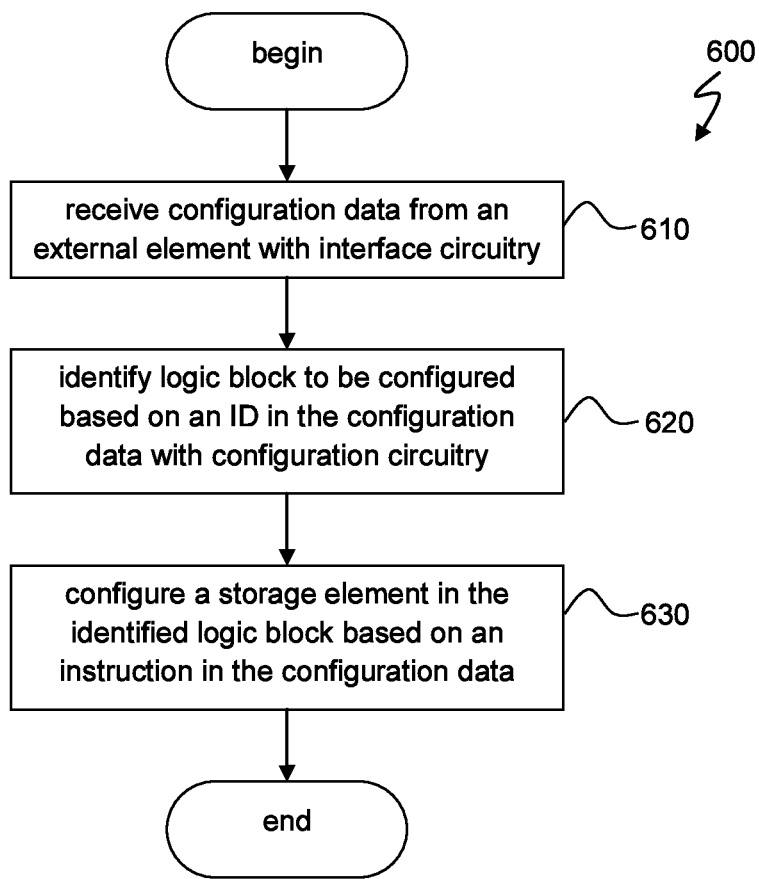
FIG. 6 shows a simplified flow for operating an IC with a plurality of logic blocks in accordance with one embodiment of the present invention.

FIG. 6 shows simplified flow 600 for operating an IC with a plurality of logic blocks in accordance with one embodiment of the present invention. At step 610, configuration data may be received from an external element. In one embodiment, the configuration data is received by interface circuitry on the IC (e.g., JTAG interface circuit 105 of FIGS. 1, 2A and 3A). At step 620, configuration circuitry on the IC may identify the logic block to be configured based on an identification field in the configuration data. In one embodiment, the configuration data may include an instruction stream similar to instruction stream 400 of FIG. 4 that includes ID field 402 and instruction field 406. At step 630, the configuration circuitry may configure a storage element in the identified logic block based on an instruction in the configuration data. In one embodiment, the identified logic block may be similar to either logic block 110 of FIG. 2B or logic block 310 of FIG. 3B.

Figure 7:
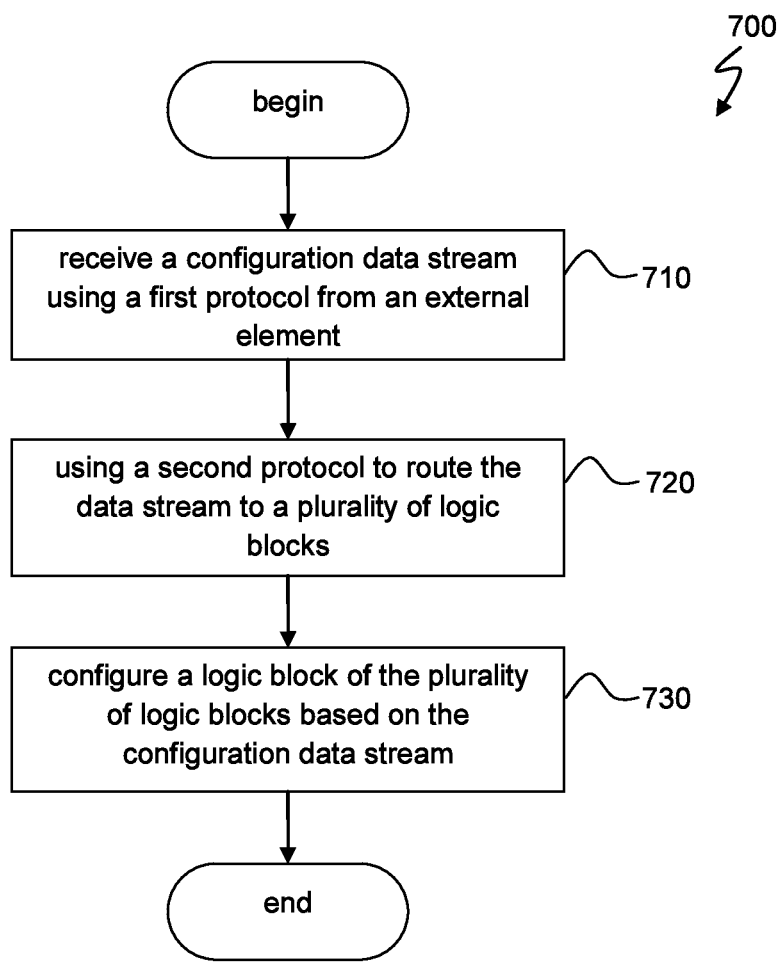
FIG. 7 shows a simplified flow for configuring an IC in accordance with one embodiment of the present invention.

FIG. 7 shows simplified flow 700 for reconfiguring an IC in accordance with one embodiment of the present invention. At step 710, a configuration data stream using a first protocol is received from an external element. At step 720, the configuration data stream is routed using a second protocol to a plurality of logic blocks. In one embodiment, the first protocol may be a JTAG interface protocol and the second protocol may be an MDIO interface protocol. At step 730, a logic block from the plurality of logic blocks is configured based on the configuration data. In one embodiment, the configuration data may include an address or ID field that may be used to identify the particular logic block from the plurality of logic blocks to be reconfigured. In another embodiment, the identified logic block may include a storage element (e.g., similar to logic blocks 110A-110F of FIG. 2A) and the configuration operation at step 730 may include storing information retrieved from the configuration data in the storage element.

Figure 8:
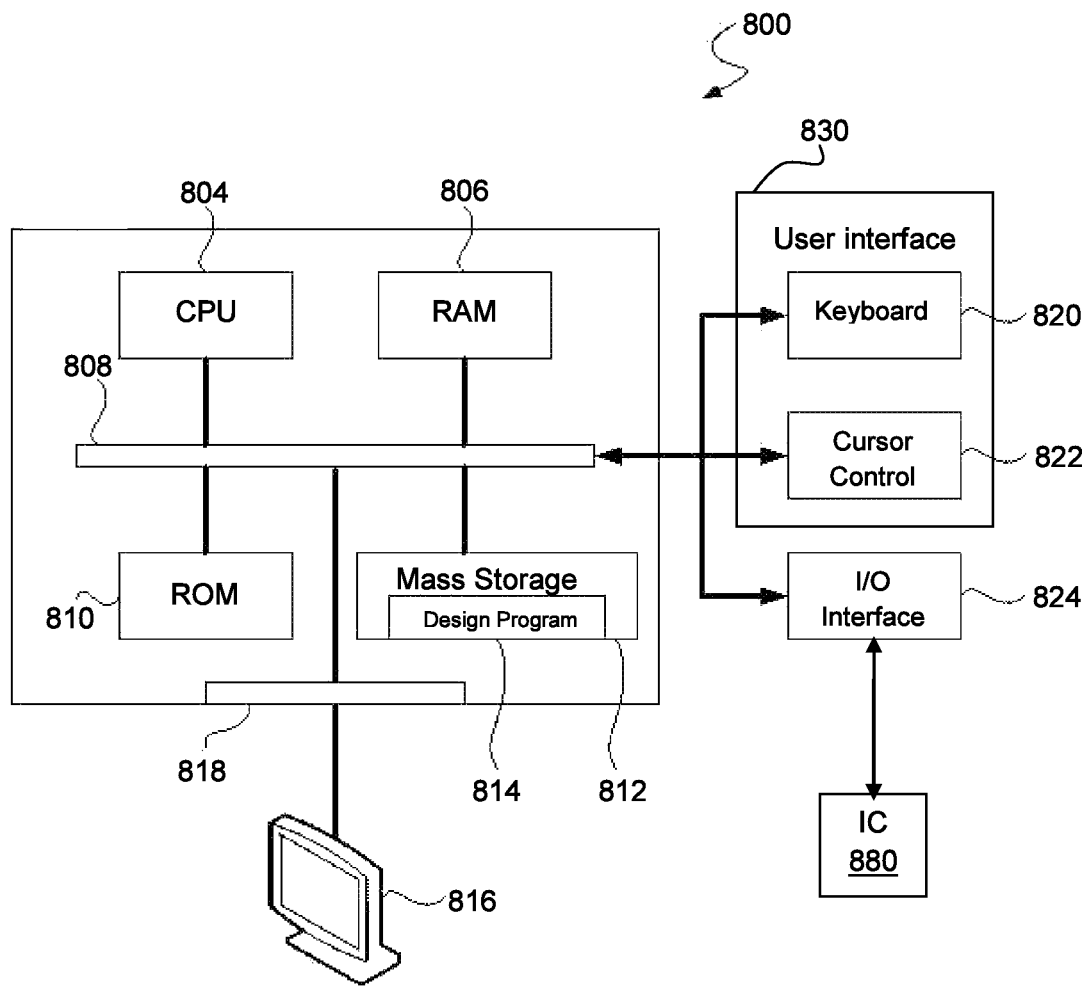
FIG. 8 is a simplified schematic diagram of a computer system for implementing embodiments of the present invention.

FIG. 8 is a simplified schematic diagram of a computer system 800 for implementing embodiments of the present invention. It should be appreciated that the methods described herein may be performed with a digital processing system, such as a conventional, general-purpose computer system. Special-purpose computers, which are designed or programmed to perform one function may be used in the alternative. In addition, the computer system of FIG. 8 may be used for configuring IC device 880. It should be appreciated that IC 880 may be similar to IC 100 of FIG. 1, IC 200 of FIG. 2A or IC 300 of FIG. 3A.

The computer system includes a central processing unit (CPU) 804, which is coupled through bus 808 to random access memory (RAM) 806, read-only memory (ROM) 810, and mass storage 812. Mass storage device 812 represents a persistent data storage device such as a flash drive or a disc drive, which may be local or remote. Design program 814 may be an electronic design automation (EDA) tool that may be operable to compile a user design and load the design to IC device 880. Design program 814 resides in mass storage 812, but can also reside in RAM 806 during processing. In one embodiment, design program 814 may include a controller module (e.g., controller module 202 of FIGS. 2A and 3A) that may be used to configure IC device 880.

It should be appreciated that CPU 804 may be embodied in a general-purpose processor, a special-purpose processor, or a specially programmed logic device. Display 816 is in communication with CPU 804, RAM 806, ROM 810, and mass storage device 812, through bus 808 and display interface 818. Display 816 is configured to display either a graphical (or text-based) user interface or other visual indicators. User interface elements 830 may include, among others, keyboard 820, cursor control 822, and may be coupled to bus 808 to communicate information or user input to CPU 804. Other interfaces, such as input-output interface 824, may also be coupled to bus 808. It should be appreciated that data to and from external devices, such as IC device 880, may be communicated through input-output interface 824. In one embodiment, input-output interface 824 may include a JTAG cable that is coupled to bus 808 and IC device 880. Accordingly, configuration data may be transmitted from design program 814 to IC 880 through input-output interface 824.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A method of operating an integrated circuit having a plurality of logic blocks that each comprise a respective input-output block, the method comprising:
   with an interface circuit, receiving configuration data from an external element during runtime, wherein the configuration data comprises an identification field and an instruction for configuring a logic block;
   with configuration circuitry, identifying the logic block to be configured from the plurality of logic blocks based on the identification field; and
   with the configuration circuitry, configuring a storage element in the identified logic block based on the instruction, wherein configuring the storage element in the identified logic block comprises:
      modifying an input-output protocol of the input-output block associated with the identified logic block.

2. The method defined in claim 1 wherein the configuration data is received through a first interface using a first protocol, and wherein the configuration circuitry comprises a bridge circuit, the method further comprising:
    with the bridge circuit, converting the configuration data from the first protocol to a second protocol; and
    routing the configuration data using the second protocol through a plurality of interconnect paths from the bridge circuit to the identified logic block.

3. The method defined in claim 2, wherein each logic block the plurality of logic blocks includes a decoder circuit operable to receive the configuration data from the configuration circuitry, the method further comprising:
    with the decoder circuit, converting the configuration data from the second protocol to a third protocol prior to the configuring the logic block.

4. The method defined in claim 3, wherein converting the configuration data from the second protocol to the third protocol includes deserializing the configuration data.

5. The method defined in claim 1, wherein the storage element comprises a configuration random access memory circuit and wherein configuring the storage element based on the instruction comprises:
    storing information retrieved from the instruction in the configuration random access memory circuit.

6. The method defined in claim 1, wherein the interface circuit comprises a Joint-Test Action Group (JTAG) interface circuit and wherein the configuration data comprises a JTAG data stream, the method further comprising:
    routing the JTAG data stream to the plurality of logic blocks, wherein each logic block of the plurality of logic blocks includes a respective bridge circuit; and
    with the bridge circuit of each logic block, converting the JTAG data stream to a data stream having a protocol that is compatible with the respective logic block of the plurality of logic blocks.

7. The method defined in claim 1, wherein the plurality of logic blocks comprises a plurality of transceiver circuits and wherein configuring the storage element in the identified logic block comprises:
    configuring the storage element in the identified logic block during normal operation of the integrated circuit.

8. A method of reconfiguring an integrated circuit, comprising:
    with an interface circuit, receiving configuration data from an external element using a first interface protocol;
    with a bridge circuit, converting the configuration data from the first interface protocol to a second interface protocol and routing the configuration data using the second interface protocol to a plurality of logic blocks through a plurality of interconnects; and
    with a decoder circuit, reconfiguring a logic block of the plurality of logic blocks based on the configuration data.

9. The method defined in claim 8 further comprising:
converting the configuration data from the second interface protocol to a third interface protocol prior to configuring the logic block.

10. The method defined in claim 9, wherein the plurality of logic blocks comprises a plurality of transceiver circuits and wherein the external element comprises a controller module operable to configure the plurality of transceiver circuits, wherein the first interface protocol comprises a Joint-Test Action Group (JTAG) protocol, and wherein the second interface protocol comprises a serial interface protocol, wherein the converting comprises:
    deserializing the configuration data to obtain a parallel configuration data stream using the third interface protocol.

11. The method defined in claim 8 further comprising:
    with the decoder circuit, identifying the logic block to be configured based on an identification field in the configuration data.

12. The method defined in claim 8, wherein each logic block of the plurality of logic blocks includes a storage element, and wherein configuring the logic block comprises:
    storing information retrieved from an instruction field in the configuration data in the storage element.

13. The method of claim 8, further comprising:
    with transceiver circuitry in the logic block, communicating with circuitry external to the integrated circuit during normal operation.

14. An integrated circuit, comprising:
    an interface circuit operable to receive configuration data from an external circuit using a first protocol;
    bridge circuitry operable to receive the configuration data from the interface circuit and further operable to convert the configuration data from the first protocol to a second protocol; and
    a plurality of logic blocks operable to receive the configuration data from the bridge circuitry using the second protocol, wherein each logic block of the plurality of logic blocks includes a storage element operable to store the configuration data.

15. The integrated circuit defined in claim 14, wherein the configuration data comprises a serial data stream, the integrated circuit further comprising:
    a deserializer circuit in each logic block of the plurality of logic blocks, wherein the deserializer circuit is operable to convert the serial data stream to a parallel data stream.

16. The integrated circuit defined in claim 14, wherein each logic block of the plurality of logic blocks comprises the bridge circuitry.

17. The integrated circuit defined in claim 14, wherein the integrated circuit is a field programmable gate array (FPGA), wherein the interface circuit comprises a Joint-Test Action Group (JTAG) circuit, wherein the plurality of logic blocks comprises a plurality of input-output blocks, and wherein the bridge circuitry is placed in a core region of the FPGA.

18. The integrated circuit defined in claim 14, wherein the plurality of logic blocks comprises a plurality of transceiver blocks, wherein the plurality of transceiver blocks is operable to receive the configuration data during normal operation of the integrated circuit.

19. The integrated circuit defined in claim 14, wherein the configuration data comprises an identification field and an instruction field.

20. The integrated circuit defined in claim 19, wherein the identification field is associated with at least one logic block of the plurality of logic blocks.

* * * * *